United States Patent
Rupp et al.

(10) Patent No.: US 10,242,840 B2
(45) Date of Patent: Mar. 26, 2019

(54) ENERGY FILTER FOR PROCESSING A POWER SEMICONDUCTOR DEVICE

(71) Applicant: Infineon Technologies AG, Neubiberg (DE)

(72) Inventors: Roland Rupp, Lauf (DE); Andre Brockmeier, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/602,761

(22) Filed: May 23, 2017

(65) Prior Publication Data
US 2017/0352519 A1    Dec. 7, 2017

(30) Foreign Application Priority Data
Jun. 6, 2016  (DE) .................. 10 2016 110 429

(51) Int. Cl.
*H01J 37/05*  (2006.01)
*H01J 37/317* (2006.01)

(52) U.S. Cl.
CPC .......... *H01J 37/05* (2013.01); *H01J 37/3171* (2013.01); *H01J 2237/057* (2013.01); *H01J 2237/31701* (2013.01)

(58) Field of Classification Search
CPC ........ H01J 37/00; H01J 37/02; H01J 37/3171; H01J 37/30; H01J 37/3007; H01J 37/3174; H01J 37/3175
USPC ........ 250/505.1, 492.1, 492.2, 423 R, 396 R
See application file for complete search history.

(56) References Cited

U.S. PATENT DOCUMENTS

| | | | |
|---|---|---|---|
| 6,755,984 B2 | 6/2004 | Lee et al. | |
| 7,906,416 B2 | 3/2011 | Tsuchitani et al. | |
| 9,006,688 B2 | 4/2015 | Daniels et al. | |
| 9,343,323 B2 | 5/2016 | Kamikubo | |
| 9,372,396 B2 | 6/2016 | Kruijt-Stegeman et al. | |
| 2003/0106619 A1* | 6/2003 | Decristofaro | H01F 1/15308 148/304 |
| 2005/0159019 A1* | 7/2005 | Lee | B82Y 10/00 438/800 |
| 2009/0045435 A1* | 2/2009 | Yao | H01L 33/22 257/103 |
| 2013/0147096 A1* | 6/2013 | Yang | G03F 7/0002 264/496 |
| 2015/0136996 A1* | 5/2015 | Inada | H01J 37/3171 250/396 R |
| 2015/0322286 A1* | 11/2015 | Cabrini | G03F 7/0002 428/195.1 |

(Continued)

FOREIGN PATENT DOCUMENTS

| | | |
|---|---|---|
| DE | 10 2015 202 121 | 8/2016 |
| JP | S56-33818 | 4/1981 |
| JP | S57-27027 | 2/1982 |

(Continued)

*Primary Examiner* — Jason L McCormack
(74) *Attorney, Agent, or Firm* — Dicke, Billig & Czaja, PLLC

(57) ABSTRACT

A method of producing an implantation ion energy filter, suitable for processing a power semiconductor device. In one example, the method includes creating a preform having a first structure; providing an energy filter body material; and structuring the energy filter body material by using the preform, thereby establishing an energy filter body having a second structure.

16 Claims, 9 Drawing Sheets

(56) References Cited

U.S. PATENT DOCUMENTS

2016/0233295 A1    8/2016  Schulze et al.

FOREIGN PATENT DOCUMENTS

| JP | H11-302026  | 11/1999 |
| JP | 2004-160647 | 6/2004  |
| JP | 2007-523440 | 8/2007  |
| JP | 2008-098530 | 4/2008  |
| JP | 2010-098310 | 4/2010  |
| JP | 2012-523708 | 10/2012 |
| JP | 2015-216182 | 12/2015 |
| JP | 2016-046385 | 4/2016  |

* cited by examiner

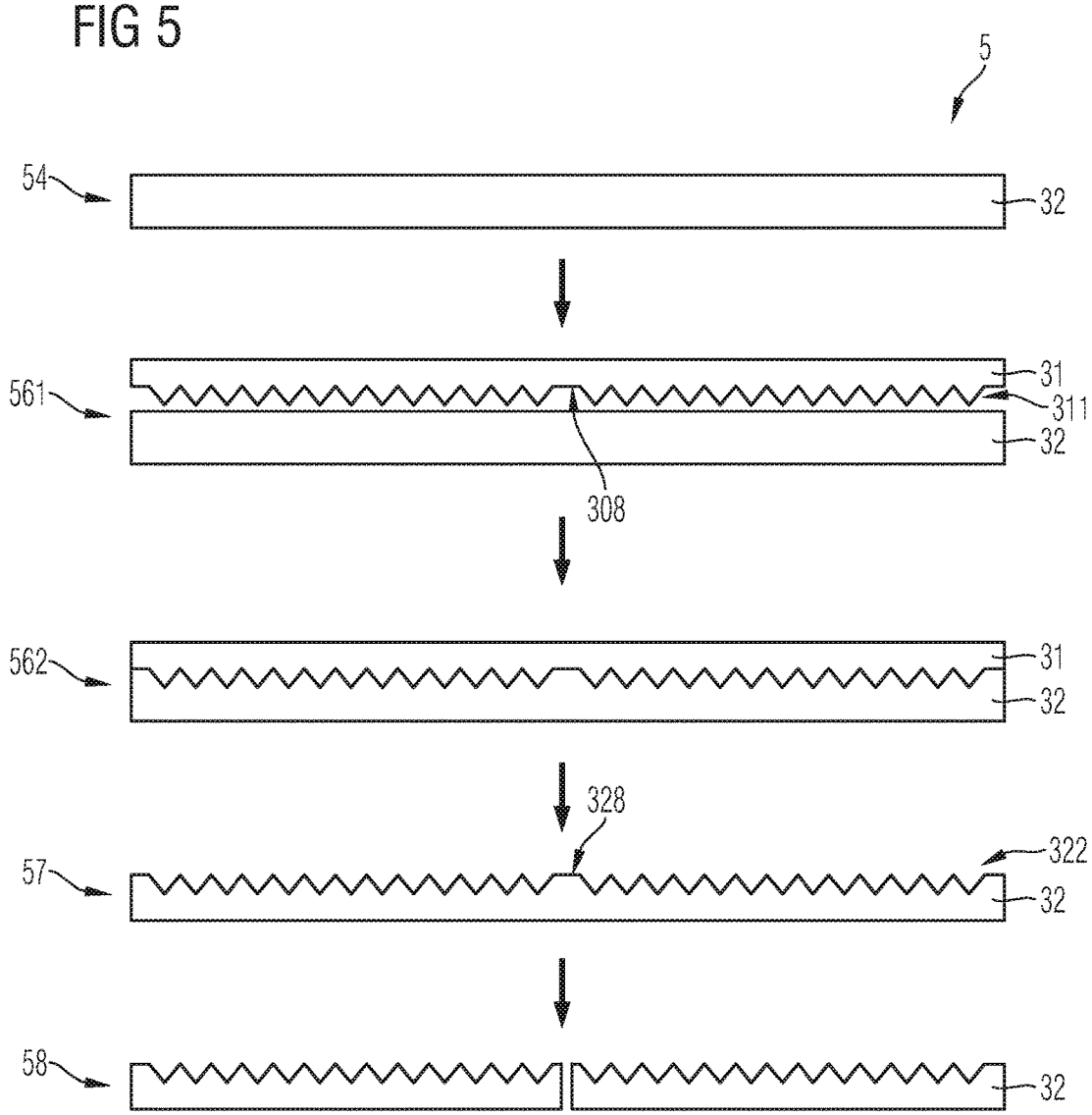

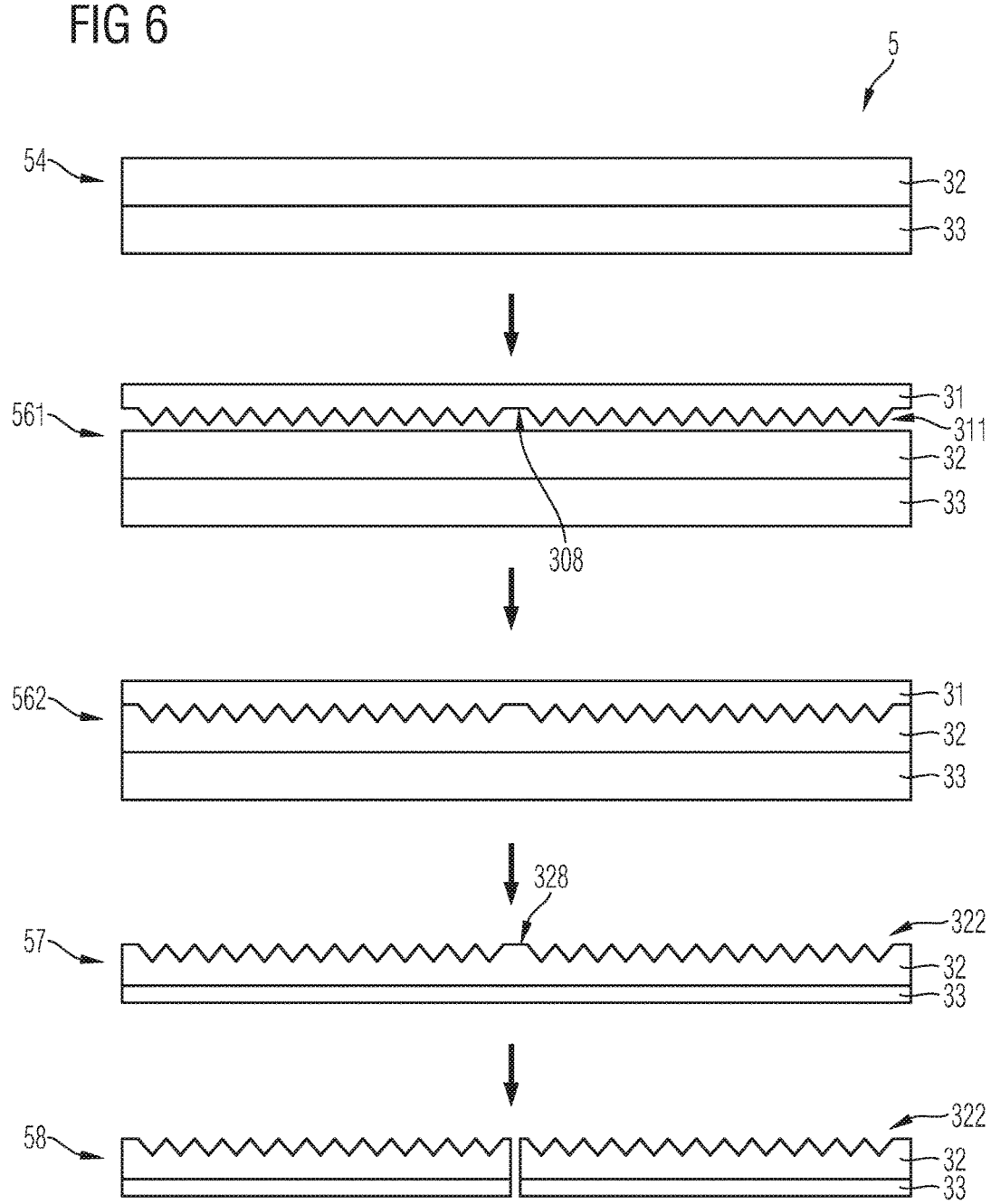

ENERGY FILTER FOR PROCESSING A POWER SEMICONDUCTOR DEVICE

CROSS-REFERENCE TO RELATED APPLICATION

This Utility Patent Application claims priority to German Patent Application No. 10 2016 110 429.9, filed Jun. 6, 2016, which is incorporated herein by reference.

TECHNICAL FIELD

This specification refers to embodiments of an implantation ion energy filter, to embodiments of a method of producing an implantation ion energy filter and to embodiments of processing a power semiconductor device. In particular, this specification is directed to embodiments of an implantation ion energy filter to be used during an ion implantation within the scope of processing a power semiconductor device, to embodiments of a method of producing such implantation ion energy filter and to embodiments of a method of processing a power semiconductor device employing such implantation ion energy filter.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Such a power semiconductor device is usually based on a semiconductor body that may be configured to conduct load current between at least two load terminals of the device. In order to ensure a load current capability, a blocking capability and/or a switching capability of the device, the semiconductor body may comprise one or more semiconductor regions exhibiting a specific dopant configuration. For example, such semiconductor regions may include a source region, a channel region (also referred to as body region), a field stop region, an emitter region, a superjunction structure (also referred to as compensation structure) and/or guard rings, to name a few examples.

Each of said semiconductor regions may include dopants of the first conductivity type, e.g., n-type dopants, and/or dopants of second conductivity type, e.g., p-type dopants, and each of the said semiconductor regions may exhibit a specific dopant concentration profile.

In order to create doped semiconductor regions in the semiconductor body, certain semiconductor device processing steps can be carried out, e.g., a diffusion processing step, an epitaxy processing step and/or an ion implantation processing step.

Regarding the ion implantation, an implantation apparatus may provide implantation ions and accelerate these along an extension direction towards a semiconductor body. In order to create a specific dopant concentration in the extension direction within the semiconductor body, in addition to a mask, a so-called implantation ion energy filter may be positioned between said implantation apparatus and the semiconductor body such that the implantation ions traverse the filter prior to entering the semiconductor body.

SUMMARY

According to an embodiment, a method of producing an implantation ion energy filter comprises: creating a preform having a first structure; providing an energy filter body material; and structuring the energy filter body material by using the preform, thereby establishing an energy filter body having a second structure.

According to a further embodiment, a method of processing a power semiconductor device comprises: providing a semiconductor body; producing, in the semiconductor body, at least one first semiconductor region doped with dopants of a first conductivity type by applying a first implantation of first implantation ions, said applying of said first implantation is carried out such that the first implantation ions traverse an energy filter prior to entering the semiconductor body, wherein the energy filter has been produced by creating a preform having a first structure; providing an energy filter body material; and structuring the energy filter body material by using the preform, thereby establishing an energy filter body having a second structure.

According to a yet further embodiment, an implantation ion energy filter comprises an energy filter body having a structure, wherein the energy filter body is configured to receive implantation ions and to output received implantation ions such that the output implantation ions exhibit a reduced energy as compared to their energy when entering the energy filter body; and wherein the energy filter body is made of an energy filter body material comprising a glass.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 5-9 each schematically and exemplarily illustrate, based on illustrations of sections of vertical cross-section of an exemplary energy filter body and an exemplary preform, steps of a method of producing an implantation ion energy filter in accordance with one or more embodiments;

DETAILED DESCRIPTION

Figure 1:
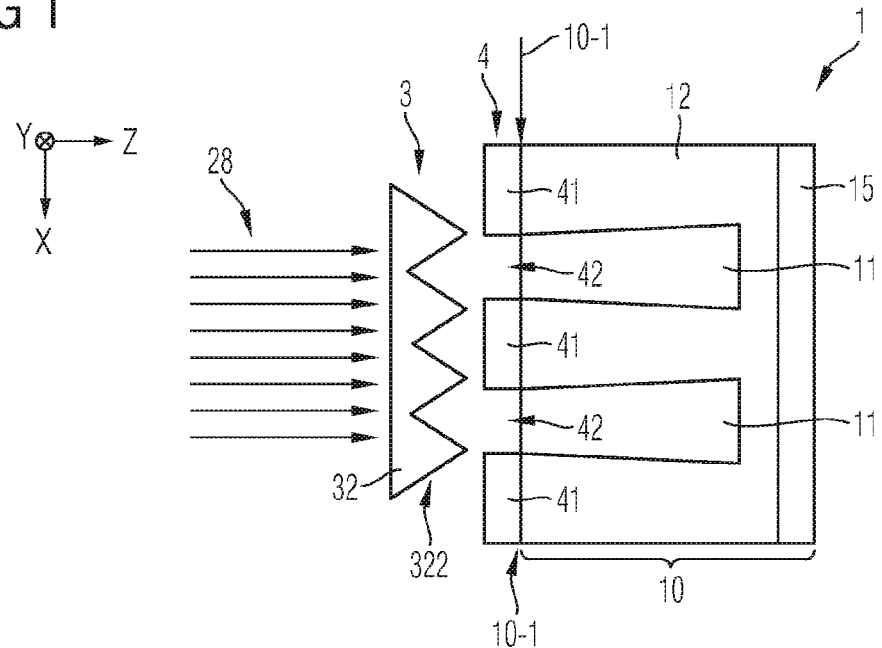
FIG. 1 schematically and exemplarily illustrates a section of a vertical cross-section of a power semiconductor device being subjected to an ion implantation in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V, e.g., greater than 1 kV, or even greater than 3 kV. For example, the processed power semiconductor device described below may be a semiconductor device exhibiting a stripe cell configuration or a needle cell configuration and can be configured to be employed as a power component in a low-, medium- and/or high voltage application.

Figure 10:
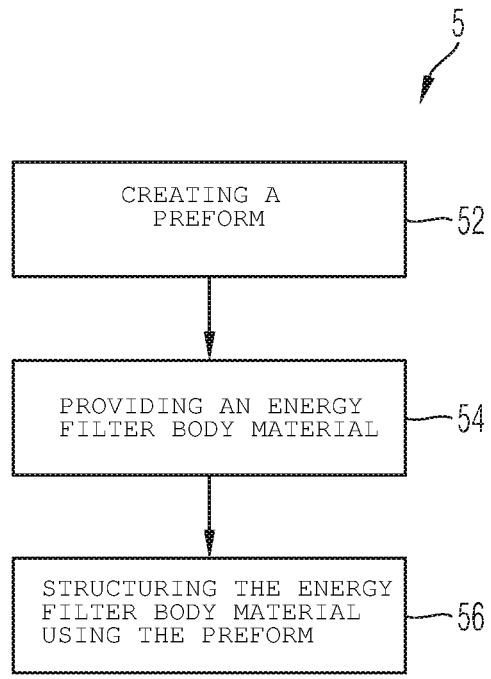
FIG. 10 schematically and exemplarily illustrates a diagram of a method of producing an implantation ion energy filter in accordance with one or more embodiments.

FIG. 10 schematically and exemplarily illustrates a diagram of an embodiment of a method 5 of producing an implantation ion energy filter. In step 52, a preform is created that has a first structure. In another step 54, which can be carried out before, simultaneously to, or after step 52, an energy filter body material is provided. In a subsequent step 56, the energy filter body material is structured by using the preform. Thereby, an energy filter body can be established that has a second structure. For example, the structured energy filter body 32 forms the implantation ion energy filter 3 (also referred to as energy filter in the following).

Figure 11:
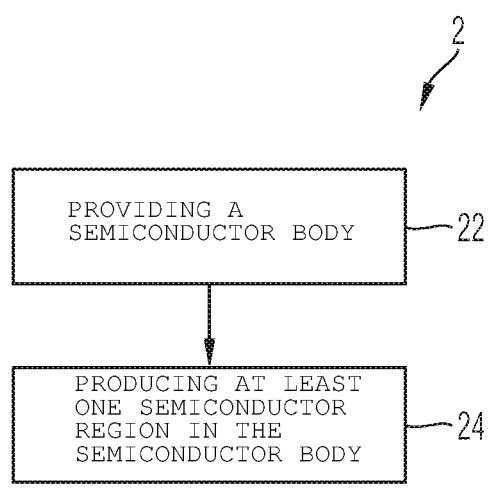
FIG. 11 schematically and exemplarily illustrates a diagram of a method of processing a power semiconductor device in accordance with one or more embodiments.

FIG. 11 schematically and exemplarily illustrates a diagram of an embodiment of a method of processing a power semiconductor device. In step 22, a semiconductor body 10 is provided. The provided semiconductor body 10 may comprise or, respectively, be made of a semiconductor body material having a dopant diffusion coefficient smaller than the dopant diffusion coefficient of silicon. For example, the semiconductor body material may have a dopant diffusion coefficient at least two orders of magnitude lower than the corresponding dopant diffusion coefficient of silicon. Said diffusion coefficient may comprise at least one of an acceptor diffusion coefficient and a donor diffusion coefficient. The semiconductor body 10 may be made of a material comprising at least one of silicon carbide, gallium nitride, aluminum nitride. In a subsequent step 24, at least one first semiconductor region is produced in the semiconductor body, the at least one first semiconductor region being doped with dopants of a first conductivity type. Said producing can be carried out by applying a first implantation of first implantation ions, wherein said applying of said first implantation can be carried out such that the first implantation ions traverse an energy filter prior to entering the semiconductor body. The energy filter may have been produced by creating a preform having a first structure; by providing an energy filter body material; and by structuring the energy filter body material by using the preform, thereby establishing an energy filter body having a second structure.

Figure 12:
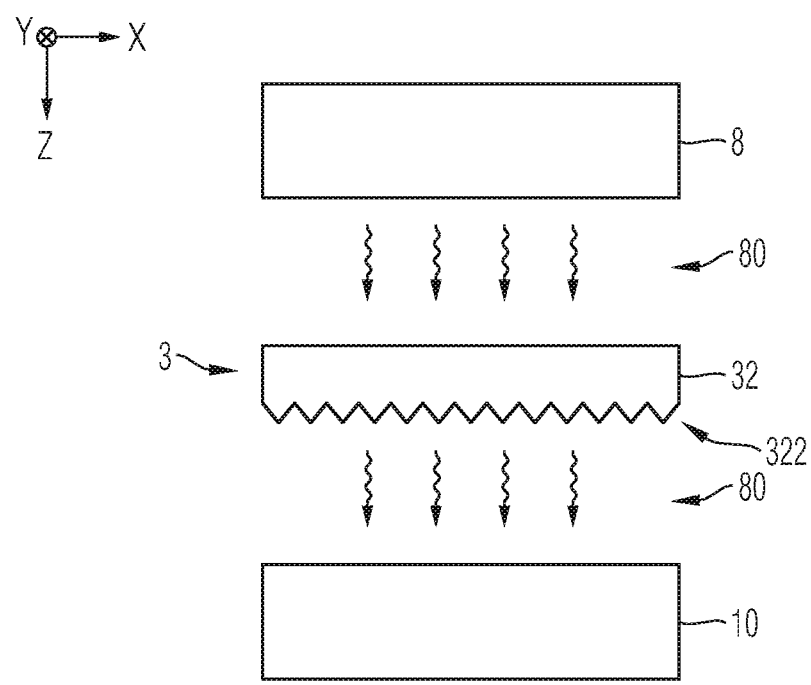
FIG. 12 schematically and exemplarily illustrates a section of a vertical cross-section of an implantation ion energy filter in accordance with one or more embodiments.

FIG. 12 schematically and exemplarily illustrates a section of a vertical cross-section of an embodiment of an implantation ion energy filter 3. The implantation ion energy filter 3 may be configured to be used during an ion implantation within the scope of processing a power semiconductor device. For example, implantation ions 80 are provided by an implantation apparatus 8, and the implantation ions 80 are being accelerated along an extension direction Z towards a semiconductor body 10. The implantation ion energy filter 3 may be positioned between said implantation apparatus 8 and the semiconductor body 10 such that the implantation ions 80 traverse the filter 3 prior to entering the semiconductor body 10. For example, the implantation ion energy filter 3 comprises an energy filter body 32 having a structure 322. Further, the energy filter body 32 can be configured to receive implantation ions 80 and to output received implantation ions such that the output implantation ions 80 exhibit a reduced energy as compared to their energy when entering the energy filter. The energy filter body 32 can be made of an energy filter body material comprising a glass. For example, the glass comprises at least one of borosilicate glass,
a soda-lime glass,
a float glass,
a quartz glass,
a porcelain,
a polymer thermoplastic,
a polymer glass,
an acrylic glass,
polycarbonate,
polyethylene terephthalate,
a silica doped with at least one dopant, the at least one dopant being selected from a group containing boron (B), sodium (Na), calcium (Ca), potassium (K) and aluminum (Al), zinc (Zn), copper (Cu), magnesium (Mg), germanium (Ge),
a polymer,
polynorbornene,
polystyrene,
polycarbonate,
polyimide, and
benzocy clobutene.

For example, the glass does not comprise silicon dioxide.

In an embodiment, the energy filter body material 32 exhibits a plasticity within a first temperature range and is stable in form within a second temperature range, the second temperature range being lower than the first temperature. For example, the energy filter body material 32 is an amorphous solid, e.g., an amorphous solid that exhibits a plasticity within the first temperature range and is stable in form within the second temperature range, the second temperature range being lower than the first temperature. For example, the first temperature range is smaller than a melting point of the preform 31. Further, the first temperature range may be greater than a comparatively high threshold value so as to allow for high ions currents during the implantation without changing the energy filter's form.

For example, regarding the method 5, structuring (cf. step 56) the energy filter body material 32 by using the preform 31 may include warming up the energy filter body material 32 to a temperature within said first temperature range. In an embodiment, as indicated above, the energy filter body material 32 may comprise a glass. Then, structuring (cf. step 56) the energy filter body material 32 may include warming up the energy filter body material 32 to a temperature of at least 90%, of at least 95%, or to a temperature of at least 98% of a glass-transition temperature of the energy filter body material 32. For example, the glass-transition temperature of the energy filter body material 32 may be within the first temperature range.

Further, regarding the method 2, during producing (cf. step 24) the at least one first semiconductor region 11 in the semiconductor body 10 by applying the first implantation such that first implantation ions traverse the energy filter 3, e.g., its energy filter body 32, the energy filter body 32 can be kept at a temperature within the second temperature range.

For example, for a chosen energy filter body material, the first temperature range may include values in between 1000° C. to 1400° C., and the second temperature range may include values smaller than 900° C. In an embodiment, the lowest temperature value of the first temperature range is greater by at least 100° C. then the highest temperature value of the second temperature range.

Exemplary aspects of the aforementioned embodiments of the method 5 of producing an implantation ion energy filter 3, of the method 2 of processing a power semiconductor device, and of the implantation ion energy filter 3 shall now be explained in greater detail with respect to FIGS. 1 to 9. Thus, it should be understood, but will now be stated about the embodiments schematically and exemplarily illustrated in FIGS. 1 to 9 may also apply to the embodiments schematically and exemplarily illustrated in FIGS. 10 to 12, if not explicitly stated otherwise.

FIG. 1 schematically and exemplarily illustrates a section of a vertical cross-section of a power semiconductor device 1 being subjected to an ion implantation 28. For example, the power semiconductor device 1 comprises a semiconductor body 10 having a substrate region 15, which can be, e.g., highly doped n-region. The semiconductor body 10 may comprise or, respectively, be made of a semiconductor body material having a dopant diffusion coefficient smaller than the dopant diffusion coefficient of silicon. For example, the semiconductor body material may have a dopant diffusion coefficient at least two orders of magnitude lower than the corresponding dopant diffusion coefficient of silicon. Said diffusion coefficient may comprise at least one of an acceptor diffusion coefficient and a donor diffusion coefficient. The semiconductor body 10 may be made of a material comprising at least one of silicon carbide, gallium nitride, aluminum nitride. During the implantation 28, a surface 10-1 of the semiconductor body 10 may be covered with a mask 4 having one or more openings 42. In another embodiment, the entire surface 10-1 may become subjected to the implantation 28 and, e.g., no mask is employed. If a mask 4 is employed, said openings 42 may allow implantation ions to penetrate the surface 10-1 of the semiconductor body 10 such that one or more first semiconductor regions 11 can be created within the semiconductor body 10. For example, by means of the implantation 28, first semiconductor regions 11 can be created that exhibit dopants of the first conductivity type and that are arranged adjacent to a second semiconductor region 12 of the semiconductor body 10. For example, the second semiconductor region 12 adjacent to the first semiconductor regions 11 can be doped with dopants of a second conductivity type complementary to the first conductivity type. The second semiconductor region 12 may have been produced by applying at least one of a second implantation 28 of second implantation ions, an epitaxy processing step and a diffusion processing step.

For example, the first semiconductor regions 11 and the second semiconductor region 12 may form a drift volume exhibiting a superjunction structure. Prior to entering the semiconductor body 10, the implantation ions may traverse an implantation ion energy filter 3, in the following also referred to as energy filter. For example, the energy filter 3 may have been produced in accordance with the method 5 schematically and exemplarily illustrated in FIG. 10. Further, the energy filter 3 may be configured in the same manner as the energy filter 3 schematically and exemplarily illustrated in FIG. 12. Accordingly, the energy filter 3 may comprise an energy filter body 32 that exhibits a structure 322.

Figure 2:
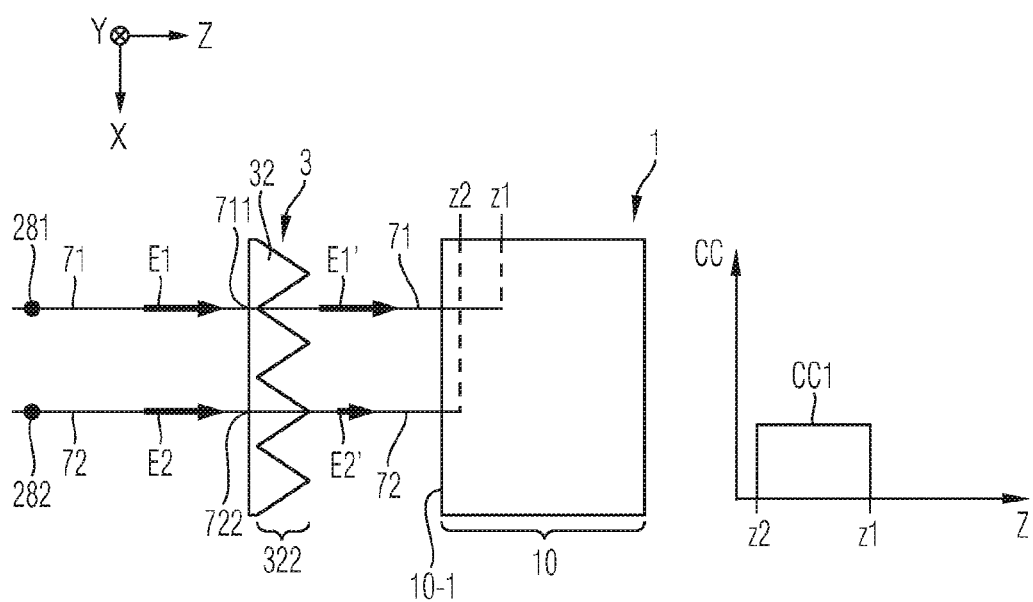
FIG. 2 schematically and exemplarily illustrates a section of a vertical cross-section of a power semiconductor device being subjected to an ion implantation along with a schematic illustration of an exemplary dopant concentration profile in accordance with one or more embodiments.
Figure 3A:
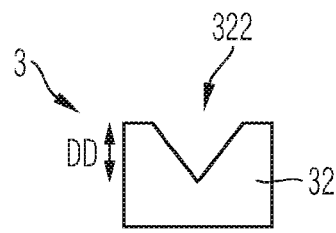
FIGS. 3A-F each schematically and exemplarily illustrate a section of a vertical cross-section of an implantation ion energy filter in accordance with one or more embodiments.
Figure 3B:
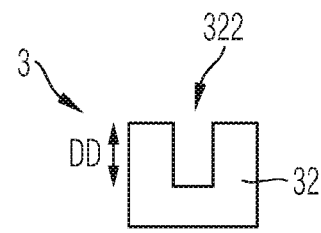
Figure 3C:
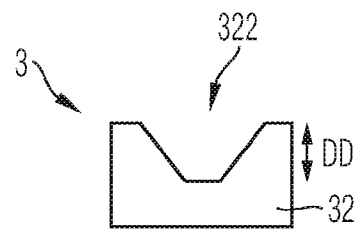
Figure 3D:
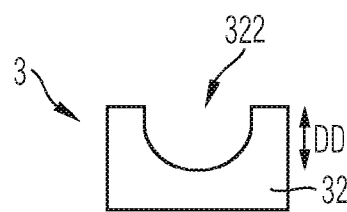
Figure 3E:
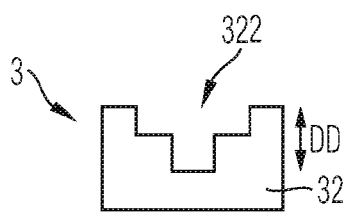
Figure 3F:
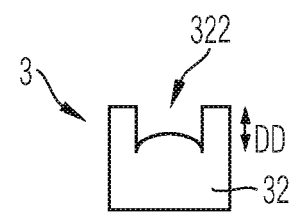

As schematically and exemplarily illustrated in FIG. 2, the energy filter 3 may be configured to receive implantation ions 281, 282 and to output received implantation ions such that the output implantation ions exhibit a reduced energy E1', E2' as compared to their energy E1, E2 when entering the energy filter 3. The respective amount of energy reduction may depend on the point and/or angle of entry into the energy filter 3. For example, a first implantation ion 281 follows a first path 71 and enters the energy filter 3 at a first point 711, exhibiting a first energy E1. Due to the structure 322 of the energy filter 3 and due to the first path 71 being substantially perpendicular to an input surface of the energy filter 3, the first implantation ion 281 traverses a comparatively thin section of the energy filter 3. Nevertheless, the energy E1' of the output first implantation ion 281 may be reduced as compared to the energy E1. A second implantation ion 282 may follow a second path 72 and may enter the energy filter 3 at a second point 712, exhibiting a second energy E2. The second energy E2 may be substantially identical to the first energy E1. Due to the structure 322 of the energy filter 3 and due to the second path 72 being substantially perpendicular to the input surface of the energy filter 3, the second implantation ion 282 traverses a comparatively thick section of the energy filter 3. Thus, the energy E2' of the output second implantation ion 282 may be significantly reduced as compared to the energy E2. Accordingly, the first implantation ion 281 may traverse the semiconductor body 10 along the extension directions Z down to a level z1, and the second implantation ion 282 may traverse the semiconductor body 10 along the extension directions Z down to a level z2, wherein, due to the different amounts of energy reductions, z1 may be significantly greater than z2. For example, the difference between the levels z1 and z2 may amount to at least 1 $\square$m, to at least 3 µm, or even to at least 5 µm. Accordingly, due to the structure 322 of the energy filter 3, a first semiconductor region 11 may be created that exhibits a specific dopant concentration profile along with the extension direction Z. An exemplary dopant concentration profile is schematically illustrated in the right part of FIG. 2, according to which the dopant concentration profile can be a so-called box profile, i.e., the dopant concentration the first semiconductor region 11 may be substantially constant along the extension direction Z and amount to a value CC1. However, it shall be understood that, depending on the configuration of the structure 322 of the energy filter 32, other dopant concentration profiles may be created, e.g., a concentration profile exhibiting one or more maxima or minima, a Gaussian dopant concentration profile, a dopant concentration that increases along the extension direction Z, a dopant concentration that decreases along the extension direction Z, a turtle shell like dopant concentration profile, to name a few examples. From this explanation, it becomes apparent that the energy filter 3 can also be referred to as energy diffusor. For example, the energy filter 3 can be configured to convert a substantially "monochrome" ion beam into an ion beam having a substantially continuous energy spectrum.

In accordance with an embodiment, the structure 322 of the energy filter 3 extends for at least 1 cm². For example, additionally or alternatively, the structure 322 of the energy filter 3 may extend for at least the width of an ion beam of the ion implantation. Further, in an embodiment, the relevant structure sizes of the structure 322 of the energy filter 3 may be dimensioned such that a specific dopant concentration profile may be achieved within the semiconductor body 10. For example, the relevant structure sizes may be within the range of or, respectively, smaller than the width of the openings 42 of the mask 4. The relevant structure sizes may also be greater than the width of the openings 42, e.g., if the energy filter 3 is spaced apart from the surface 10-1 of the semiconductor body 10, e.g., by at least 0.5 mm.

Now referring to FIGS. 3A-F, some exemplary structures 322 of the energy filter body 32 of embodiments of the energy filter 3 shall be explained. In accordance with the embodiment schematically illustrated in FIG. 3A, the structure 322 of the energy filter body 32 may be formed by one or more triangular-like or pyramid-like shaped recesses. In accordance with the embodiment schematically illustrated in FIG. 3B, the structure 322 of the energy filter body 32 may be formed by one or more rectangular-like or square-like shaped recesses. In accordance with the embodiment schematically illustrated in FIG. 3C, the structure 322 of the energy filter body 32 may be formed by one or more trapezoid-like recesses. In accordance with the embodiment schematically illustrated in FIG. 3D, the structure 322 of the energy filter body 32 may be formed by one or more part-circle-like or a part-ellipse-like shaped recesses. In accordance with the embodiment schematically illustrated in FIG. 3E, the structure 322 of the energy filter body 32 may be formed by one or more recesses exhibiting a stepped or graded profile. In accordance with the embodiment schematically illustrated in FIG. 3F, the structure 322 of the energy filter body 32 may be formed by one or more recesses having a concave profile. Each of these aforementioned different recesses may also be combined with each other in single energy filter body 32 to form further structures 322. For example, said recesses that form the structure 322 may be arranged on an output side (also referred to as first side herein) of the energy filter body 32 where the implantation ions leave the energy filter body 32. Further, an input side of the energy filter body 32 (also referred to as second side herein) where the implantation ions may enter the energy filter body 32 can exhibit substantially planar surface, e.g., an unstructured surface. In accordance with other embodiments, also the input side of the energy filter body 32 may be structured, e.g., for establishing a frame structure configured to ensure a stable mechanical installation of the energy filter 3 or for establishing a structure similar or identical to the structure 322, e.g., similar to the structure of the output side, as will be explained in more detail below. It shall be emphasized that what has been stated about the embodiment of the energy filter 3 schematically illustrated in FIG. 12 may equally apply to the embodiments schematically illustrated in FIGS. 3A-F.

Figure 4A:
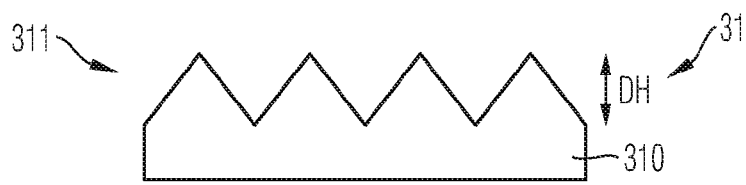
FIGS. 4A-B each schematically and exemplarily illustrate a section of a vertical cross-section of a preform in accordance with one or more embodiments.
Figure 4B:
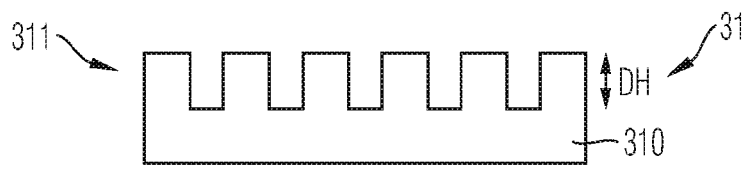

As has been explained above, producing the energy filter 3 may involve creating a preform that has a first structure. Exemplary embodiments of such preform are schematically illustrated in FIGS. 4A-B. Accordingly, the preform 31 may comprise a preform body having the first structure 311. As illustrated in FIG. 4A, the first structure 311 may be formed by one or more triangular-like or pyramid-like shaped elevations. For example, the first structure 311 of the embodiment of the preform 31 according to FIG. 4A has been produced by carrying out a wet etch processing step, e.g., on a semiconductor based preform 31. Alternatively or additionally, the first structure 311 may also be formed by one or more rectangular-like or square-like shaped elevations, as illustrated in FIG. 4B. For example, the first structure 311 of the embodiment of the preform 31 according to FIG. 4B has been produced by carrying out a dry etch processing step, e.g., on a semiconductor based preform 31. Irrespectively of the material of the preform 31, producing the preform 31, e.g., establishing the first structure 311, may additionally or alternatively include carrying out at least one of ion beam milling, ion beam writing, wet etching, laser ablation, milling and mechanical sawing. As at least in some embodiments, the preform 31 may be used for producing the energy filter 3, from the foregoing description of FIGS. 3A-F, it becomes apparent that the first structure 311 of the preform 31 may also be formed by one or more elevations having a shape different from the elevations exemplarily illustrated in FIG. 4A and FIG. 4B. For example, the first structure 311 of the preform 31 is formed by one or more elevations with a respect elevation height DH within the range of 0.1 µm to 20 µm, or within a range of 5 µm to 10 µm. Accordingly, in an example, the second structure 322 of the energy filter 3 may be formed by one or more recesses with a respect recess depth DD within the range of 0.1 µm to 20 µm, or within a range of 5 µm to 10 µm. Also, the widths of the elevations forming the first structure 311, or respectively, the widths of the recesses forming the second structure 322, can be within the range of 0.1 µm to 20 µm, or within a range of 5 µm to 10 µm.

In accordance with an embodiment, the preform 31 can be made of a material comprising at least one of a semiconductor material, e.g., silicon and/or silicon carbide, a ceramic, e.g., $Al_2O_3$ and/or $Al_2TiO_5$, and a high-grade steel. The material of the preform 31 may also include one or more of silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe). Further, the preform 31 may include an anti-stick coating (not illustrated) which may separating the preform 31 from the energy filter body 32 after the structuring step.

For example, creating the preform 31 (cf. step 52) may comprise processing a base layer 310 by carrying out at least one of an
  etch processing step, e.g., a wet etch processing step, e.g., based on an alkaline solution, and/or dry etch processing step, e.g. including RIE and/or ion beam etching, and
  a mechanical processing step, e.g., a milling step.

The processed base layer 310 may form the preform 31. For example, the processed base layer 310 is a semiconductor layer 310, e.g., based on silicon.

As has been generally explained with respect to the embodiment of the method 5 schematically illustrated in FIG. 10, the method 5 of producing the energy filter 3 may include providing (cf. step 54) an energy filter body material 32 and structuring (cf. step 56) the energy filter body material 32 by using the preform 31 so as to establish the energy filter body 32 having the said structure 322, the latter also being referred to as second structure 322 within this specification.

In an embodiment, structuring the energy filter body material 32 may include carrying out an imprint step using the preform 31 as a stamp. For example, to this end, the energy filter body material 32 may be softened, e.g., by heating up the energy filter body material 32 such that it is deformable and subsequently, i.e., after the imprint step, cooling down the energy filter body material 32. For example, the imprint step may include an embossing step, e.g., a hot embossing step. Further optional aspects of the embodiment of the method where the structuring includes carrying out the imprint step will be explained in more detail below.

In accordance with another embodiment, structuring the energy filter body material 32 may include carrying out at least one of a casting processing step and a molding processing step. Thus, for example, the energy filter body material 32 may be heated up such that it becomes liquid and it may then be poured into the preform 31. For example, the energy filter body material 32 may become solid within the preform 31 and may subsequently be removed from the preform 31.

For example, structuring the energy filter body material 32 for establishing the structure 322 does not include an etch processing step.

For example, the structure 322 of the energy filter body 32 may be complementary to the structure 311 of the preform 31. For example, said elevations forming the structure 311 of the preform 31 may define the shape of said recesses forming the structure 322 of the energy filter body 32. Accordingly, in an embodiment, the preform 31 may be considered as a negative form 31.

In accordance with an embodiment, a plurality of energy filter bodies 32, each of which having the second structure 322, are established by using the same preform 31. Accordingly, the preform 31 may be configured to be used to produce a plurality of implantation ion energy filters 3, e.g., more than ten energy filters 3, more than 50 energy filters 3, or even more than 100 energy filters 3. As in this embodiment, the same preform 31 is used to produce a plurality of implantation ion energy filters 3, the produced energy filters 3 do substantially not deviate from each other in structure 322; e.g., the structures 322 of each of the plurality of energy filters 3 that have been produced using the same preform 31 may be substantially identical to each other, since each of the plurality of structures 322 may have been established by means of the first structure of the preform 31. Accordingly, a high reproducibility of a power semiconductor device, e.g., the power semiconductor device 1 schematically illustrated in FIG. 1, e.g., the configuration formed by the first semiconductor regions 11 and the second semiconductor region 12, may be ensured. This embodiment includes the recognition that energy filters used during ion implantation, e.g., high energy ion implantations with energies greater than 2 MeV, within the scope of processing power semiconductor devices may need to be replaced after a certain operating duration. For example, the energy filter employed therein may become worn-out after some time.

With regards to FIGS. 5 to 9, some exemplary embodiments of the method 5 of producing the energy filter 3 shall now be explained. These exemplary embodiments of the method 5 may include common processing steps and it shall be understood that what is stated about a certain processing step with respect to a specific one of FIGS. 5 to 9 may equally apply to an embodiment in accordance with another one of FIGS. 5 to 9, if not explicitly stated otherwise.

In accordance with the embodiment schematically illustrated in FIG. 5, the energy filter body material 32 is provided in step 54. As indicated above, the energy filter body material 32 may be provided as a solid glass, for example. In a step 561, the preform 31 having the first structure 311 may be aligned with the provided energy filter body 32. Then, in a step 562, a force may be applied to the preform 31 such that the first structure 311 penetrates into the energy filter body 32, wherein the energy filter body 32 may have been softened, e.g., by heating up, before applying the force to the preform 31. Thereby, the second structure 322 may be established at the energy filter body 32. This structuring can be done with an imprint step, e.g., a micro-imprint step and/or a nano-imprint step, e.g., a hot embossing step. After a certain amount of time, the preform 31 may be separated from the energy filter body 32. Further, method 5 may include a removing step 57, wherein a section of a side of the energy filter body 32 has not been structured is removed, e.g., by grinding and/or etching, so as to decrease the total thickness of the energy filter body 32. As schematically illustrated in each of FIGS. 5 to 9, the first structure 311 of the preform 31 may exhibit an interruption 308 which may cause a corresponding interruption 328 in the second structure 322 of the energy filter body 32. In an embodiment, method 5 may further include the step 58 of dividing the energy filter body 32 into at least two separate bodies, wherein said dividing may be carried out at said interruption 328. The dividing may include applying at least one of a laser-separation processing step and a mechanical sawing processing step, i.e., the energy filter body 32 may be separated by means of a laser beam.

In accordance with the embodiment schematically illustrated in FIG. 6, in step 54, the energy filter body material 32 is provided as a part of a carrier-glass-compound wafer arrangement 32, 33. For example, the energy filter body material 32 is a glass that is supported by a carrier 33, e.g., a semiconductor carrier 33, e.g., be based on silicon. For example, the arrangement 32, 33 may have been produced by coupling the energy filter body 32 to the carrier by means of carrying out at least one of a bonding step, e.g., an anodic bonding step, and a adhesion processing step. Steps 561, 562, 57 and 58 as schematically illustrated in FIG. 6 may be carried out in the same manner as has been explained with respect to FIG. 5 above, wherein in step 57, only a part of the carrier 33 is removed so as to decrease the total thickness of the carrier-glass-compound wafer arrangement 32, 33. The carrier-glass-compound wafer arrangement having the second structure 322 may then serve as the energy filter 3.

Figure 7:
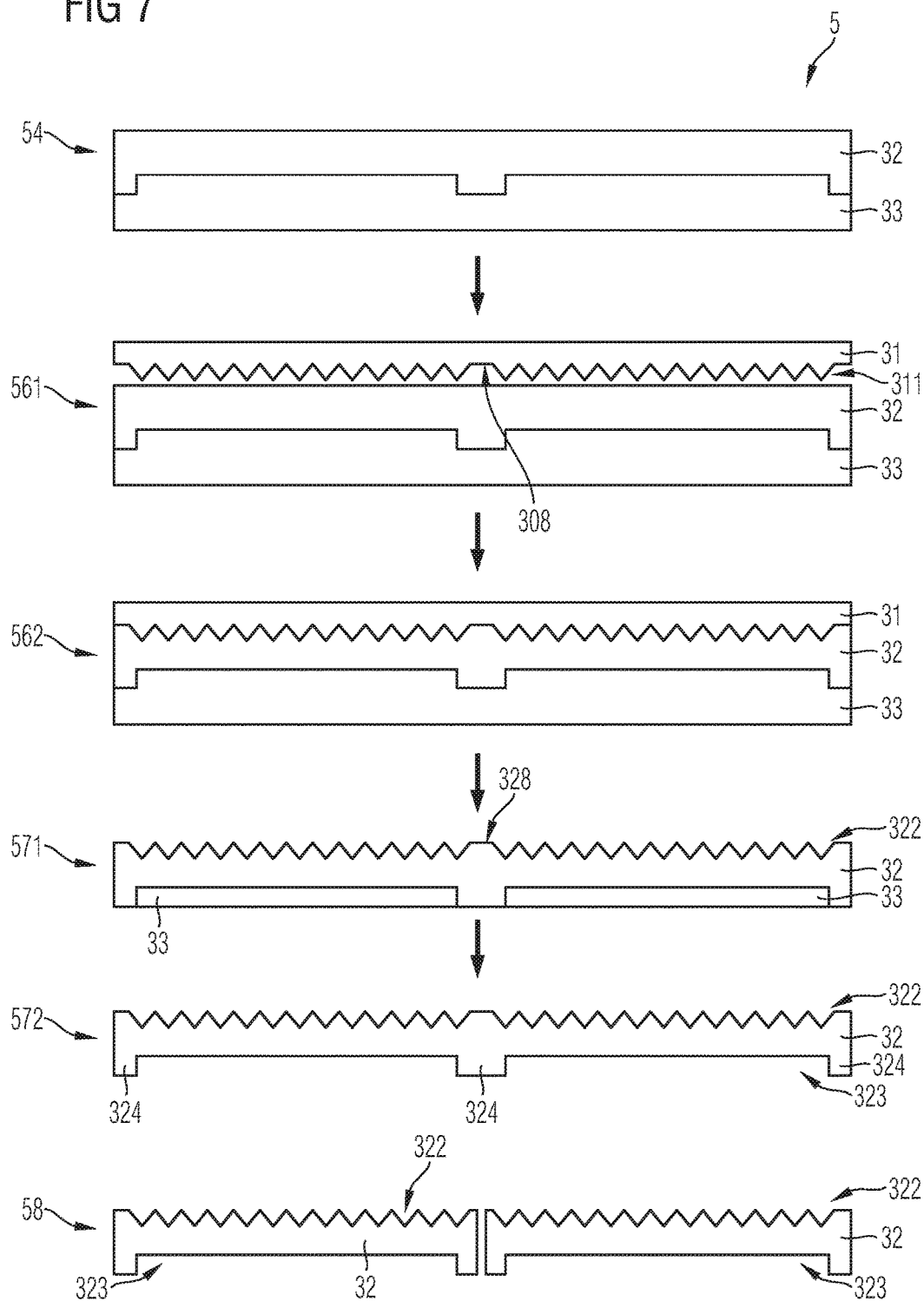

Also in accordance with the embodiment schematically illustrated in FIG. 7, the energy filter body material 32 is provided, in step 54, as a part of a carrier-glass-compound wafer arrangement 32, 33. For example, the energy filter body material 32 is a glass that is supported by the carrier 33, which may be based on silicon. However, in this embodiment, the energy filter body 32 may already be pre-structured on a side that is not subjected to the step of structuring, in step 56, the energy filter body 32 by using the preform 31. Steps 561 and 562 as schematically illustrated in FIG. 7 may be carried out in the same manner as has been explained with respect to FIG. 5 above. Then, the carrier 33 may be entirely removed, wherein said removing may comprise, in step 571, carrying out a grinding step so as to remove those section of the carrier 33 that do not contribute to the structure, and then, in step 572, carrying out an etch processing step so as to remove the remaining portion of the carrier 33. Thereby, a third structure 323 may be established at the energy filter body 32. The third structure 323 may be constituted by one or more legs 324 that laterally confine one or more wells, as illustrated in FIG. 7. This third structure 323 may facilitate mechanical mounting of the energy filter 3, e.g., within the power semiconductor device processing apparatus. Accordingly, the third structure 323 may constitute a frame structure configured to be used for mechanically mounting the energy filter 3. Thus, said frame structure may be a stabilizing frame structure, in accordance with one or more embodiments.

Figure 8:
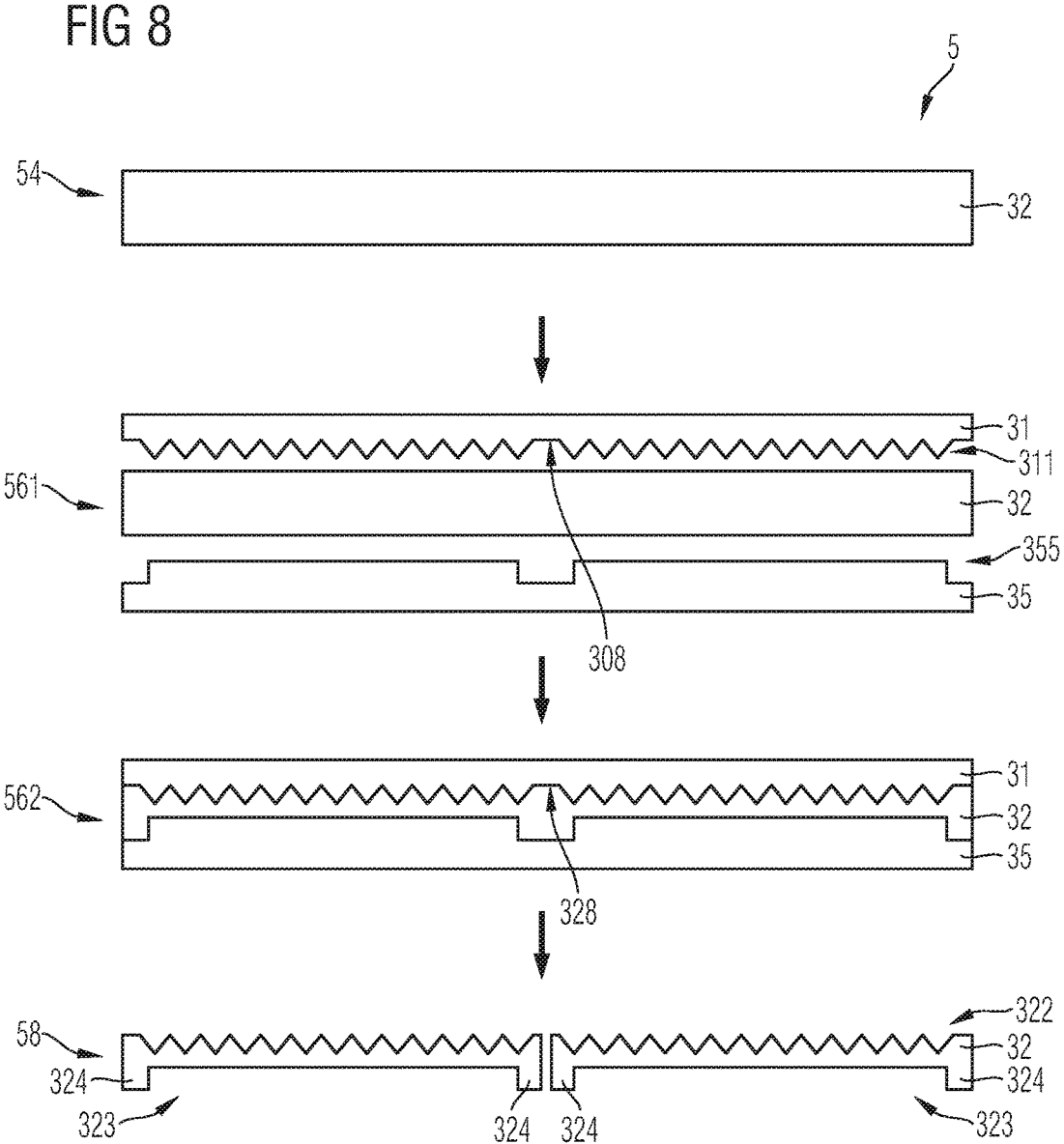

In accordance with the embodiment schematically illustrated in FIG. 8, similar to the embodiment schematically illustrated in FIG. 7, the second structure 322 may be established on a first side of the energy filter body 32 and the third structure 323 may be established on a second side of the energy filter body 32. But, in contrast to the embodiment of FIG. 7 according to which the third structure 323 may be defined by the carrier 33, a second preform 35 may be created that exhibits a further structure 355 and, during step 561, both the preform 31 and the further preform 35 may be aligned with the energy filter body 32. Then, in step 562, forces may be applied, e.g., simultaneously, to both preforms 31 and 35 such that the preform 31 penetrates the semiconductor body 32—which may have been softened before, e.g., by means of a temperature processing step—at its first side and such that the further preform 35 penetrates a semiconductor body 32 at its second side. Thereby, both the second structure 322 and the third structure 323 may be established, wherein the second structure 322 may be complimentary to the first structure 311 and wherein the third structure 323 may be complimentary to the further structure 355.

Figure 9:
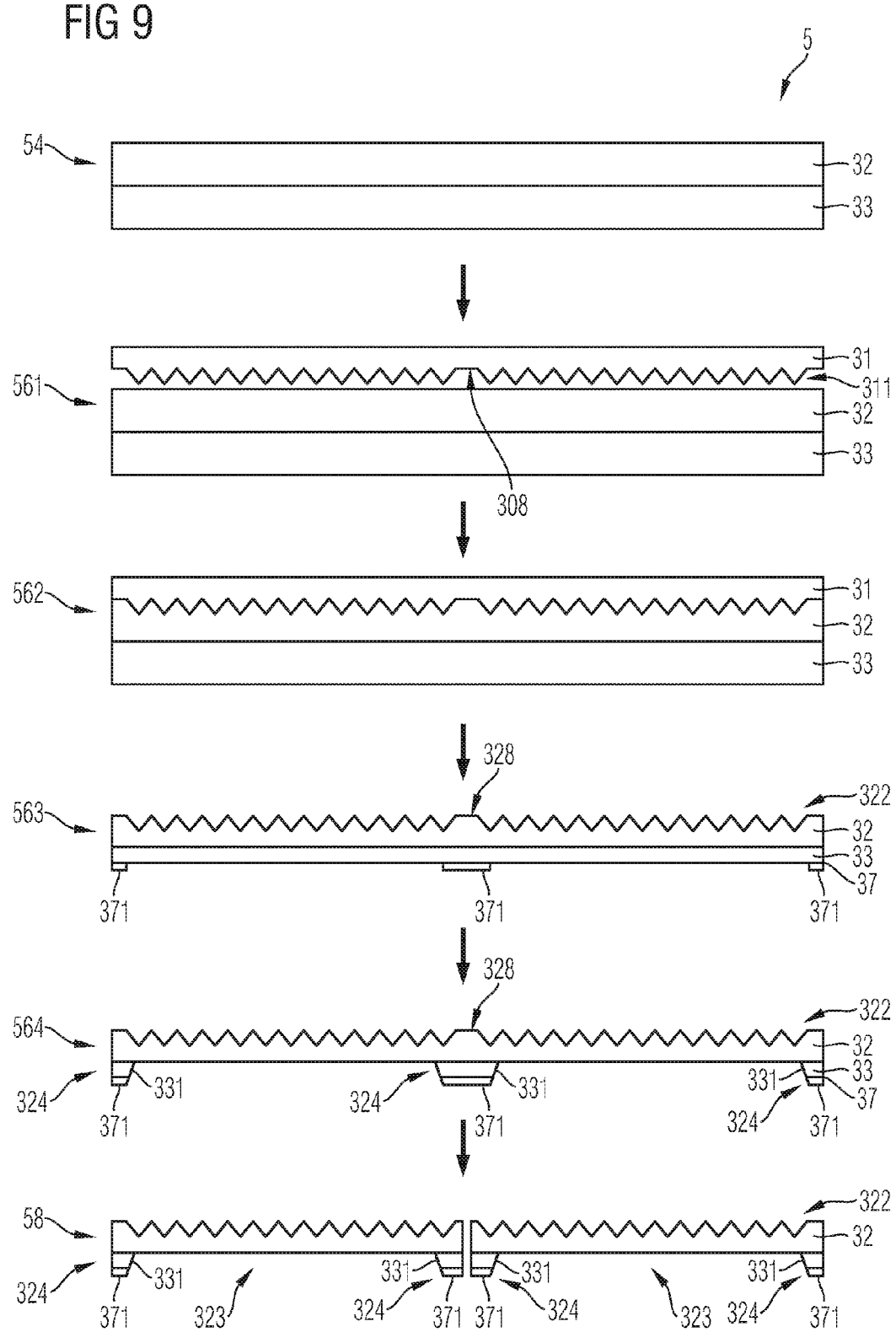

In an embodiment, the second structure 322 may be a micro structure or a nano structure, whereas, as schematically illustrated in FIGS. 7 to 9, the third structure 323 may be substantially less fine as compared to the second structure 322. For example, in an embodiment, the second structure 322 serves the purpose of energy diffusion, as has been explained with respect to FIG. 2, whereas the third structure 323 rather serves the purpose of ensuring a stable mechanical installation of the energy filter 3.

In accordance with the embodiment schematically illustrated in FIG. 9, steps 54 to 562 may be carried out in the same manner as has been explained with respect to FIG. 6. After carrying out step 562, a section of the carrier 33 may be removed, e.g., in a manner as has been explained with respect to step 57 illustrated in FIG. 6, e.g., by carrying out grinding step and/or an etch processing step. Then, in step 563, a mask 37, e.g., a hard mask 37, may be produced on the remaining layer of the carrier 33, e.g., by means of carrying out a deposition and/or a structuring processing step. The mask 37 may comprise one or more support means 371. For example, the support means 371 are aligned with the interruptions 328 of the second structure 322 of the energy filter body 32, e.g., the support means 371 are arranged at positions where the energy filter body 32 is later to be divided into at least two bodies within step 58. In step 564, the portions of the remaining layer of the carrier 33 that are not covered by the support means 371 may be removed, e.g., by carrying out an etch processing step, thereby exposing the second side of the energy filter body 32. Accordingly, the legs 324 may be formed by a stack comprising a respective remaining part 333 of the carrier 33 and a respective support means 371. As has been explained above, the third structure 323 may be configured to facilitate mechanical mounting of the energy filter 3, e.g., within the power semiconductor device processing apparatus. Accordingly, the third structure 323 may constitute a frame structure, e.g., a stabilizing frame structure, as has been mentioned above.

In the above, embodiments pertaining to power semiconductor device processing methods were explained. For example, these semiconductor devices are based on silicon (Si). Accordingly, a monocrystalline semiconductor region or layer, e.g., the region 10, 11, 12 and 15 of exemplary embodiments, can be a monocrystalline Si-region or Si-layer. In other embodiments, polycrystalline or amorphous silicon may be employed.

It should, however, be understood that the semiconductor body 10 and components, e.g., regions 10, 11, 12 and 15 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of producing an implantation ion energy filter, comprising:
   creating a preform having a first structure;
   providing an energy filter body material, wherein the energy filter body material is an amorphous solid material; and
   structuring the energy filter body material by using the preform, wherein the energy filter body material comprises a glass, and wherein structuring the energy filter body material includes warming up the glass to a temperature of at least 90% of a glass-transition temperature of the energy filter body material, thereby establishing an energy filter body that is the amorphous solid material having a second structure.

2. The method of claim 1, wherein the second structure is complementary to the first structure.

3. The method of claim 1, wherein structuring the energy filter body material includes carrying out an imprint step using the preform as a stamp.

4. The method of claim 3, wherein the imprint step includes an embossing step.

5. The method of claim 1, wherein structuring the energy filter body material includes carrying out at least one of casting processing step and a molding processing step.

6. The method of claim 1, wherein a plurality of energy filter bodies, each of which having the second structure, are established by using the same preform.

7. The method of claim 1, wherein creating the preform comprises processing a base layer by carrying out at least one of an etch processing step and a mechanical processing step, wherein the processed base layer forms the preform.

8. The method of claim 1, wherein the preform is made of a material comprising at least one of a semiconductor, a ceramic, and a high-grade steel.

9. The method of claim 1, claims, wherein the energy filter body material is provided as a part of a carrier-glass-compound wafer arrangement.

10. The method of claim 1, wherein the second structure is established on a first side of the energy filter body, and wherein the method further includes structuring a second side of the energy filter body so as to establish a third structure at the second side of the energy filter body.

11. The method of claim 10, wherein structuring the second side of the energy filter body includes:
    creating a further preform having a further structure;
    using the further preform for establishing the third structure at the second side of the glass energy filter body.

12. The method of claim 11, wherein the third structure is complementary to the further structure.

13. The method of claim 1, wherein the structured energy filter body forms the implantation ion energy filter.

14. The method of claim 13, wherein the implantation ion energy filter is configured to receive implantation ions and to output received implantation ions such that the output implantation ions exhibit a reduced energy as compared to their energy when entering the implantation ion energy filter, wherein the respective amount of energy reduction depends on the point and/or angle of entry into the implantation ion energy filter.

15. The method of claim 1, wherein provided energy filter body material is a glass.

16. The method of claim 15, wherein the glass comprises at least one of
borosilicate glass,
a soda-lime glass,
a float glass,
a quartz glass,
a porcelain,
a polymer thermoplastic,
a polymer glass,
an acrylic glass,
polycarbonate,
polyethylene terephthalate,
an undoped silica,
a silica doped with at least one dopant, the at least one dopant being selected from a group containing boron, sodium, calcium, potassium and aluminum, zinc, copper, magnesium, germanium,
a polymer,
polynorbornene,
polystyrene,
polycarbonate,
polyimide, and
benzocyclobutene.

* * * * *